United States Patent
Tanaka et al.

(10) Patent No.: US 11,676,800 B2
(45) Date of Patent: Jun. 13, 2023

(54) SUBSTRATE PROCESSING APPARATUS AND CONTROL METHOD OF SUBSTRATE PROCESSING APPARATUS

(71) Applicant: Tokyo Electron Limited, Tokyo (JP)

(72) Inventors: Ikko Tanaka, Miyagi (JP); Lifu Li, Miyagi (JP); Hiroshi Tsujimoto, Miyagi (JP); Atsushi Terasawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/241,442

(22) Filed: Apr. 27, 2021

(65) Prior Publication Data
US 2021/0335577 A1 Oct. 28, 2021

(30) Foreign Application Priority Data

Apr. 27, 2020 (JP) .............................. JP2020-078481

(51) Int. Cl.
*H01J 37/32* (2006.01)
(52) U.S. Cl.
CPC .. *H01J 37/32183* (2013.01); *H01J 37/32935* (2013.01)
(58) Field of Classification Search
None
See application file for complete search history.

(56) References Cited

U.S. PATENT DOCUMENTS

| | | | | |
|---|---|---|---|---|
| 6,197,116 B1 * | 3/2001 | Kosugi | ................... | C23C 16/50 118/712 |
| 6,446,572 B1 * | 9/2002 | Brcka | ................... | C23C 14/358 118/723 AN |
| 7,190,119 B2 * | 3/2007 | Patrick | .............. | H01J 37/32174 315/111.21 |
| 8,053,991 B2 * | 11/2011 | Kim | ........................ | H03H 7/40 315/111.21 |
| 8,129,283 B2 * | 3/2012 | Mori | ................. | H01J 37/32706 438/729 |
| 8,546,266 B2 * | 10/2013 | Mori | ................. | H01L 21/32136 216/68 |
| 8,988,012 B2 * | 3/2015 | Yoshikawa | ....... | H01J 37/32192 315/39 |
| 9,076,637 B2 * | 7/2015 | Mori | ................. | H01J 37/32798 |
| 9,663,858 B2 * | 5/2017 | Nagami | ............ | H01J 37/32165 |

(Continued)

FOREIGN PATENT DOCUMENTS

JP 2015-090770 A 5/2015

*Primary Examiner* — Srinivas Sathiraju
(74) *Attorney, Agent, or Firm* — Xsensus LLP (57) ABSTRACT

A substrate processing apparatus includes a substrate stage on which a substrate is disposed, a first radio-frequency power supply configured to supply first radio-frequency power having a first frequency to the substrate stage, an impedance converter configured to convert an impedance on a load side seen from the first radio-frequency power supply into a set impedance, a second radio-frequency power supply configured to supply second radio-frequency power having a second frequency lower than the first frequency to the substrate stage, and a controller configured to control the set impedance of the impedance converter, and the controller sets the set impedance according to a substrate processing.

8 Claims, 9 Drawing Sheets

(56) References Cited

U.S. PATENT DOCUMENTS

| | | | |
|---|---|---|---|
| 9,754,768 B2* | 9/2017 | Yamada | H01J 37/32568 |
| 9,805,916 B2* | 10/2017 | Konno | H01J 37/32146 |
| 9,831,064 B2* | 11/2017 | Konno | H01J 37/32146 |
| 9,997,337 B2* | 6/2018 | Mori | H01J 37/32706 |
| 10,229,815 B2* | 3/2019 | Koshiishi | H01J 37/32137 |
| 10,593,519 B2* | 3/2020 | Yamada | H01J 37/32568 |
| 2008/0190893 A1* | 8/2008 | Mori | H01L 21/32137 |
| | | | 257/E21.252 |
| 2011/0297533 A1* | 12/2011 | Mori | H01J 37/32798 |
| | | | 204/192.33 |
| 2015/0096684 A1* | 4/2015 | Nagami | C23C 16/52 |
| | | | 156/345.28 |
| 2015/0122420 A1* | 5/2015 | Konno | H01J 37/32926 |
| | | | 156/345.28 |
| 2015/0122421 A1* | 5/2015 | Konno | H01J 37/32183 |
| | | | 156/345.28 |
| 2019/0062947 A1* | 2/2019 | Savas | H01L 21/68707 |
| 2021/0020412 A1* | 1/2021 | Kim | H01J 37/3244 |
| 2021/0335577 A1* | 10/2021 | Tanaka | H01J 37/32935 |
| 2021/0398778 A1* | 12/2021 | Kim | H01J 37/32174 |
| 2022/0037129 A1* | 2/2022 | Koshimizu | H01J 37/32706 |

\* cited by examiner

SUBSTRATE PROCESSING APPARATUS AND CONTROL METHOD OF SUBSTRATE PROCESSING APPARATUS

CROSS-REFERENCE TO RELATED APPLICATION

This application is based on and claims priority from Japanese Patent Application No. 2020-078481, filed on Apr. 27, 2020 with the Japan Patent Office, the disclosure of which is incorporated herein in its entirety by reference.

TECHNICAL FIELD

The present disclosure relates to a substrate processing apparatus and a control method of the substrate processing apparatus.

BACKGROUND

Japanese Patent Laid-Open Publication No. 2015-090770 discloses plasma etching apparatus capable of stably controlling the load power in a radio-frequency power supply.

SUMMARY

According to one aspect of the present disclosure, there is provided a substrate processing apparatus including a substrate stage configured to dispose a substrate thereon, a first radio-frequency power supply configured to supply first radio-frequency power having a first frequency to the substrate stage, an impedance converter configured to convert an impedance on a load side seen from the first radio-frequency power supply into a set impedance, a second radio-frequency power supply configured to supply second radio-frequency power having a second frequency lower than the first frequency to the substrate stage, and a controller configured to control the set impedance of the impedance converter. The controller sets the set impedance according to a substrate processing.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments for carrying out the present disclosure will be described with reference to the drawings. In the present specification and the drawings, substantially the same configurations will be designated by the same reference numerals to omit duplicate explanations.

[Overall Configuration of Substrate Processing Apparatus 1]

Figure 1:
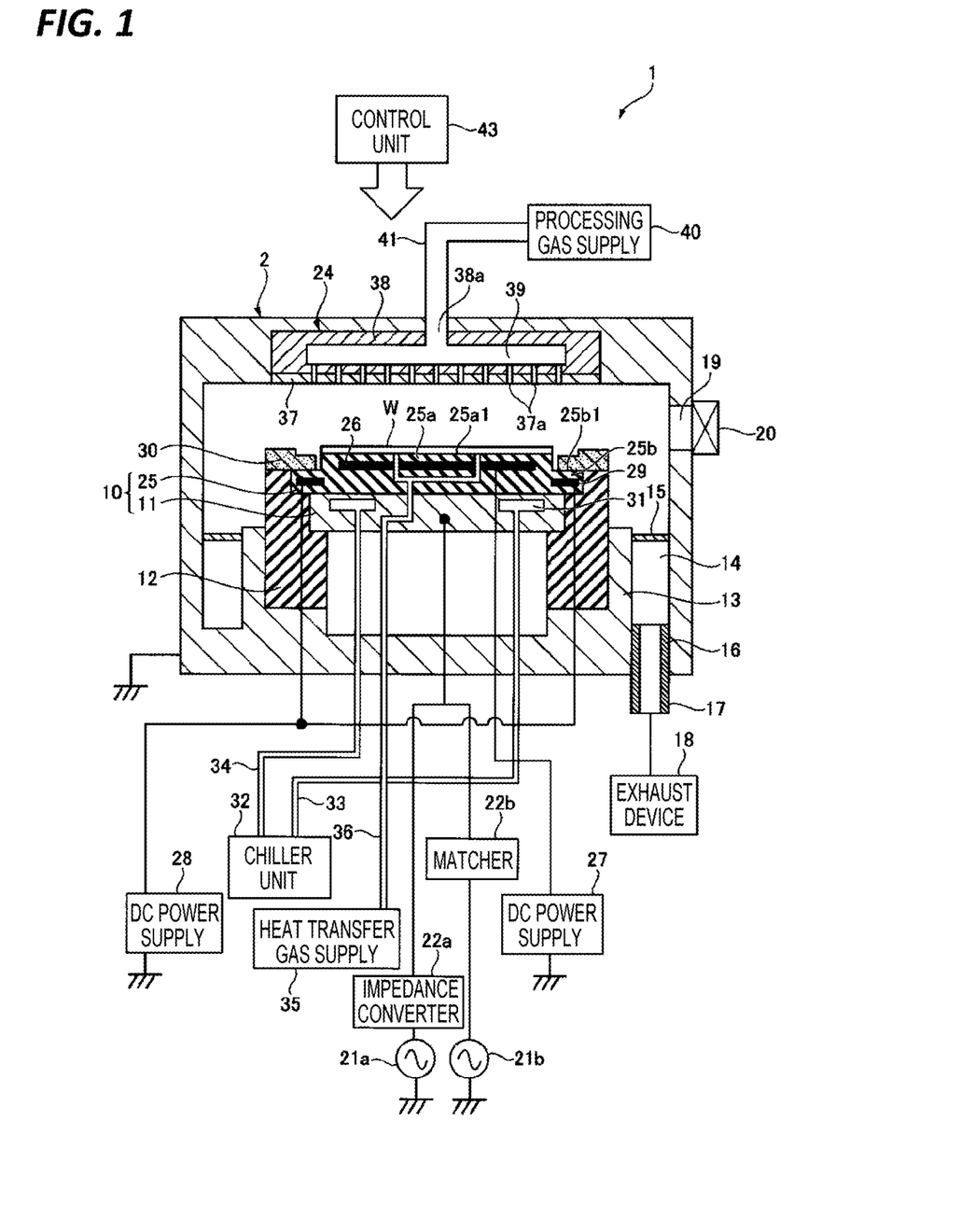
FIG. 1 is a cross-sectional view illustrating a schematic configuration of a substrate processing apparatus according to an embodiment.

First, an example of an overall configuration of a substrate processing apparatus 1 will be described with reference to FIG. 1. FIG. 1 is a cross-sectional view illustrating a schematic configuration of the substrate processing apparatus 1 according to an embodiment. In the embodiment, descriptions will be made on an example in which the substrate processing apparatus 1 is a reactive ion etching (RIE) type substrate processing apparatus.

In FIG. 1, the substrate processing apparatus 1 has a grounded cylindrical processing container 2 made of a metal such as, for example, aluminum or stainless steel, and a disc-shaped stage 10 on which a substrate W is placed is arranged in the processing container 2. The stage 10 includes a base 11 and an electrostatic chuck 25. The base 11 (stage 10) functions as a lower electrode. The base 11 contains, for example, aluminum. The base 11 is supported by a tubular support 13 extending vertically upward from the bottom of the processing container 2 via an insulating tubular holding member 12.

An exhaust passage 14 is formed between the sidewall of the processing container 2 and the tubular support 13, an annular baffle plate 15 is arranged at the entrance or in the middle of the exhaust passage 14, and an exhaust port 16 is provided in the bottom of the exhaust passage 14. An exhaust device 18 is connected to the exhaust port 16 via an exhaust pipe 17. Here, the exhaust device 18 has a dry pump and a vacuum pump, and decompresses a processing space in the processing container 2 to a predetermined degree of vacuum. Further, the exhaust pipe 17 has an automatic pressure control valve (hereinafter, referred to as "APC"), which is a variable type butterfly valve, and the APC automatically performs a pressure control in the processing container 2. Furthermore, a gate valve 20 is attached to the sidewall of the processing container 2 to open and close a carry-in/out opening 19 for the substrate W.

A first radio-frequency power supply 21a is connected to the base 11 via an impedance converter 22a. Further, a second radio-frequency power supply 21a is connected to the base 11 via a matcher 22b. The first radio-frequency power supply 21a supplies radio-frequency power for plasma generation having a predetermined frequency (e.g., 40 MHz) to the base 11 (stage 10). The second radio-frequency power supply 21b supplies radio-frequency power for ion implantation having a predetermined frequency (e.g., 400 kHz) lower than that of the first radio-frequency power supply 21a to the base 11 (stage 10).

A shower head 24 that also functions as an upper electrode is arranged in the ceiling of the processing container 2. Accordingly, radio-frequency voltages of two frequencies from the first radio-frequency power supply 21a and the second radio-frequency power supply 21b are applied between the base 11 (stage 10) and the shower head 24.

The electrostatic chuck 25 is provided on the upper surface of the base 11 to attract the substrate W by an electrostatic attraction force. The electrostatic chuck 25 has a disc-shaped central portion 25a on which the substrate W is placed and an annular outer peripheral portion 25b formed so as to surround the central portion 25a. The central portion 25a protrudes upward in the drawing with respect to the outer peripheral portion 25b. The upper surface of the central portion 25a is a substrate placing surface 25a1 on which the substrate W is placed. The upper surface of the outer peripheral portion 25b is an edge ring placing surface 25b1 on which an edge ring 30 is placed. The edge ring placing surface 25b1 is configured to place the edge ring 30 around the substrate placing surface 25a1. The edge ring 30 is also referred to as a focus ring. Further, the central portion 25a is configured by sandwiching an electrode plate 26 containing a conductive film between a pair of dielectric films. A DC power supply 27 is electrically connected to the electrode plate 26. The outer peripheral portion 25b is configured by sandwiching an electrode plate 29 containing a conductive film between a pair of dielectric films. A DC power supply 28 is electrically connected to the electrode plate 29.

The DC power supply 27 and the DC power supply 28 are configured to be changeable in the level and polarity of a DC voltage to be supplied. The DC power supply 27 applies a DC voltage to the electrode plate 26 under the control of a control unit 43 to be described later. The DC power supply 28 applies a DC voltage to the electrode plate 29 under the control of the control unit 43. The electrostatic chuck 25 generates an electrostatic force such as a Coulomb force by the voltage applied to the electrode plate 26 from the DC power supply 27, thereby causing the substrate W to be attracted to and held on the electrostatic chuck 25 by the electrostatic force. Further, the electrostatic chuck 25 generates an electrostatic force such as a Coulomb force by the voltage applied to the electrode plate 29 from the DC power supply 28, thereby causing the edge ring 30 to be attracted to and held on the electrostatic chuck 25 by the electrostatic force.

In the electrostatic chuck 25 of the embodiment, an electrostatic chuck for the substrate W and an electrostatic chuck for the edge ring 30 are integrated, but the electrostatic chuck for the substrate W and the electrostatic chuck 30 may be separate electrostatic chucks. That is, the electrode plate 26 and the electrode plate 29 may be configured so as to be sandwiched between independent dielectric films, respectively. Further, the electrode plate 29 of the embodiment is exemplified by a unipolar electrode, but may be a bipolar electrode. The bipolar electrode may attract the edge ring 30 even when no plasma is generated.

For example, an annular coolant chamber 31 is provided inside the base 11 to extend in the circumferential direction. A coolant having a predetermined temperature (e.g., cooling water) is circulated and supplied from a chiller unit 32 to the coolant chamber 31 via pipes 33 and 34, and a processing temperature of the substrate W on the electrostatic chuck 25 is controlled by the temperature of the coolant. The coolant is a temperature adjustment medium that is circulated and supplied to the pipes 33 and 34. The temperature adjustment medium may not only cool but also heat the base 11 and the substrate W.

Further, a heat transfer gas supply 35 is connected to the electrostatic chuck 25 via a gas supply line 36. The heat transfer gas supply 35 uses the gas supply line 36 to supply a heat transfer gas to a space between the central portion 25a of the electrostatic chuck 25 and the substrate W. A gas having thermal conductivity (e.g., He gas) is suitably used as the heat transfer gas.

The shower head 24 in the ceiling has an electrode plate 37 having multiple gas vent holes 37a on the lower surface thereof and an electrode support body 38 that detachably supports the electrode plate 37. A buffer chamber 39 is provided inside the electrode support body 38, and a processing gas supply 40 is connected to a gas inlet 38a that communicates with the buffer chamber 39 via a gas supply pipe 41.

Each component of the substrate processing apparatus 1 is connected to the control unit 43. For example, the exhaust device 18, the first radio-frequency power supply 21a, the second radio-frequency power supply 21b, the impedance converter 22a, the matcher 22b, the DC power supply 27, the DC power supply 28, the chiller unit 32, the heat transfer gas supply 35, and the processing gas supply 40 are connected to the control unit 43. The control unit 43 controls each component of the substrate processing apparatus 1.

The control unit 43 has a central processing unit (CPU) (not illustrated) and a storage device such as a memory (not illustrated), and performs a desired processing in the substrate processing apparatus 1 by reading and executing a program and a processing recipe stored in the storage device.

In the substrate processing apparatus 1, the gate valve 20 is first opened, so that the substrate W, which is a processing target, is carried into the processing container 2 and is placed on the electrostatic chuck 25. Then, in the substrate processing apparatus 1, the processing gas (e.g., a mixed gas containing $C_4F_6$ gas, $C_4F_8$ gas, $O_2$ gas, and Ar gas) from the processing gas supply 40 is introduced into the processing container 2 at predetermined flow rate and flow rate ratio, and the pressure in the processing container 2 is set to a predetermined value by the exhaust device 18.

Furthermore, in the substrate processing apparatus 1, the radio-frequency powers having different frequencies are supplied respectively from the first radio-frequency power supply 21a and the second radio-frequency power supply 21b to the base 11 (stage 10). Further, in the substrate processing apparatus 1, the DC voltage from the DC power supply 27 is applied to the electrode plate 26 of the electrostatic chuck 25 to attract the substrate W to the electrostatic chuck 25. Further, in the substrate processing apparatus 1, the DC voltage from the DC power supply 28 is applied to the electrode plate 29 of the electrostatic chuck 25 to attract the edge ring 30 to the electrostatic chuck 25. The processing gas discharged from the shower head 24 is turned into plasma, and the substrate W is etched by radicals or ions in the plasma.

[Configuration of First Radio-Frequency Power Supply 21a for Plasma Generation and Impedance Converter 22a]

Figure 2:
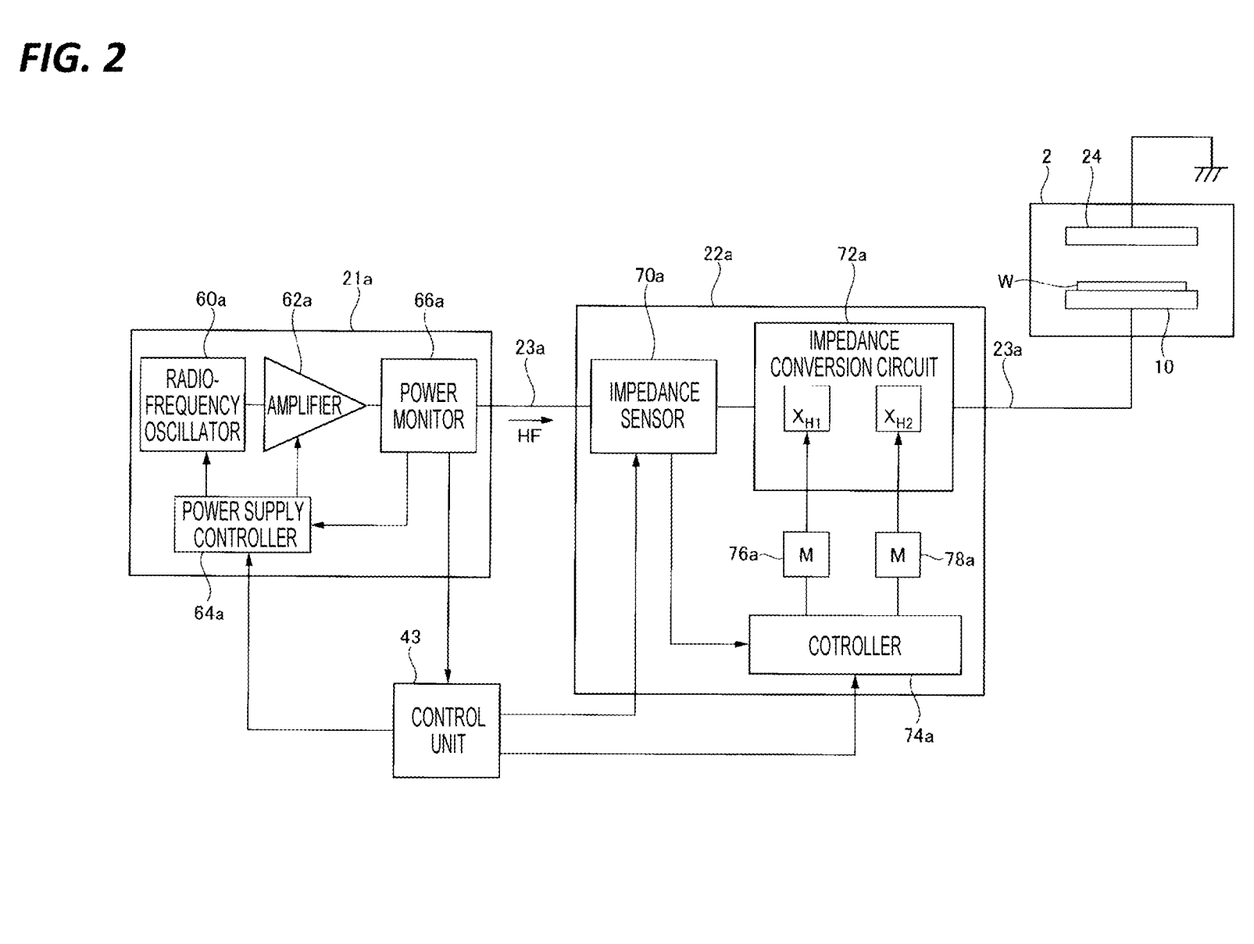
FIG. 2 is a block diagram illustrating a configuration of a radio-frequency power supply for plasma generation and an impedance converter of the substrate processing apparatus according to the embodiment.

FIG. 2 is a block diagram illustrating a configuration of the first radio-frequency power supply 21a for plasma generation and the impedance converter 22a of the substrate processing apparatus 1 according to the embodiment.

The first radio-frequency power supply 21a outputs first radio-frequency power HF having a first frequency (e.g., 40 MHz) to the impedance converter 22a via a radio-frequency feeding line 23a. The first radio-frequency power supply 21a includes a radio-frequency oscillator 60a, a power amplifier 62a, a power supply control unit 64a, and a power monitor 66a.

The radio-frequency oscillator 60a is an oscillator that generates sine waves or fundamental waves having a constant frequency (e.g., 40 MHz) suitable for plasma generation of radio-frequency discharge. The power amplifier 62a is an amplifier that amplifies the power of the fundamental waves output from the radio-frequency oscillator 60a with a gain or amplification factor that may be variably controlled. The power supply control unit 64a is a control unit that directly controls the radio-frequency oscillator 60a and the power amplifier 62a according to a control signal from the control unit 43.

The power monitor 66a detects the power of the radio-frequency power on the radio-frequency feeding line 23a. The power monitor 66a includes a directional coupler on the radio-frequency feeding line 23a. The power monitor 66a detects the power PF1 of progressive waves propagating in the forward direction on the radio-frequency feeding line 23a, i.e., from the first radio-frequency power supply 21a to the impedance converter 22a. Further, the power monitor 66a detects the power RF1 of a reflected waves propagating in the reverse direction on the radio-frequency feeding line 23a, i.e., from the impedance converter 22a to the first radio-frequency power supply 12a. Then, the power monitor 66a outputs the detection result to the power supply control unit 64a and the control unit 43. The power supply control unit 64a uses the detection result for a power feedback control.

The impedance converter 22a converts impedances. The impedance converter 22a includes an impedance sensor 70a, an impedance conversion circuit 72a, and a controller 74a. The impedance sensor 70a is a detector that measures the impedance on the load side including the impedance of the impedance conversion circuit 72a on the radio-frequency feeding line 23a. The impedance conversion circuit 72a is a circuit including a plurality of (e.g., two) controllable reactance elements (e.g., variable capacitors or variable inductors) $X_{H1}$ and $X_{H2}$ which are connected to the radio-frequency feeding line 23a. The controller 74a controls the reactance elements $X_{H1}$ and $X_{H2}$, respectively, via a motor (M) 76a and a motor (M) 78a. The controller 74a controls the motors 76a and 78a such that the impedance detected by the impedance sensor 70a becomes the impedance set by the control unit 43.

The stage 10 is an example of a substrate stage.

[Configuration of Second Radio-Frequency Power Supply 21b for Ion Implantation and Matcher 22b]

Figure 3:
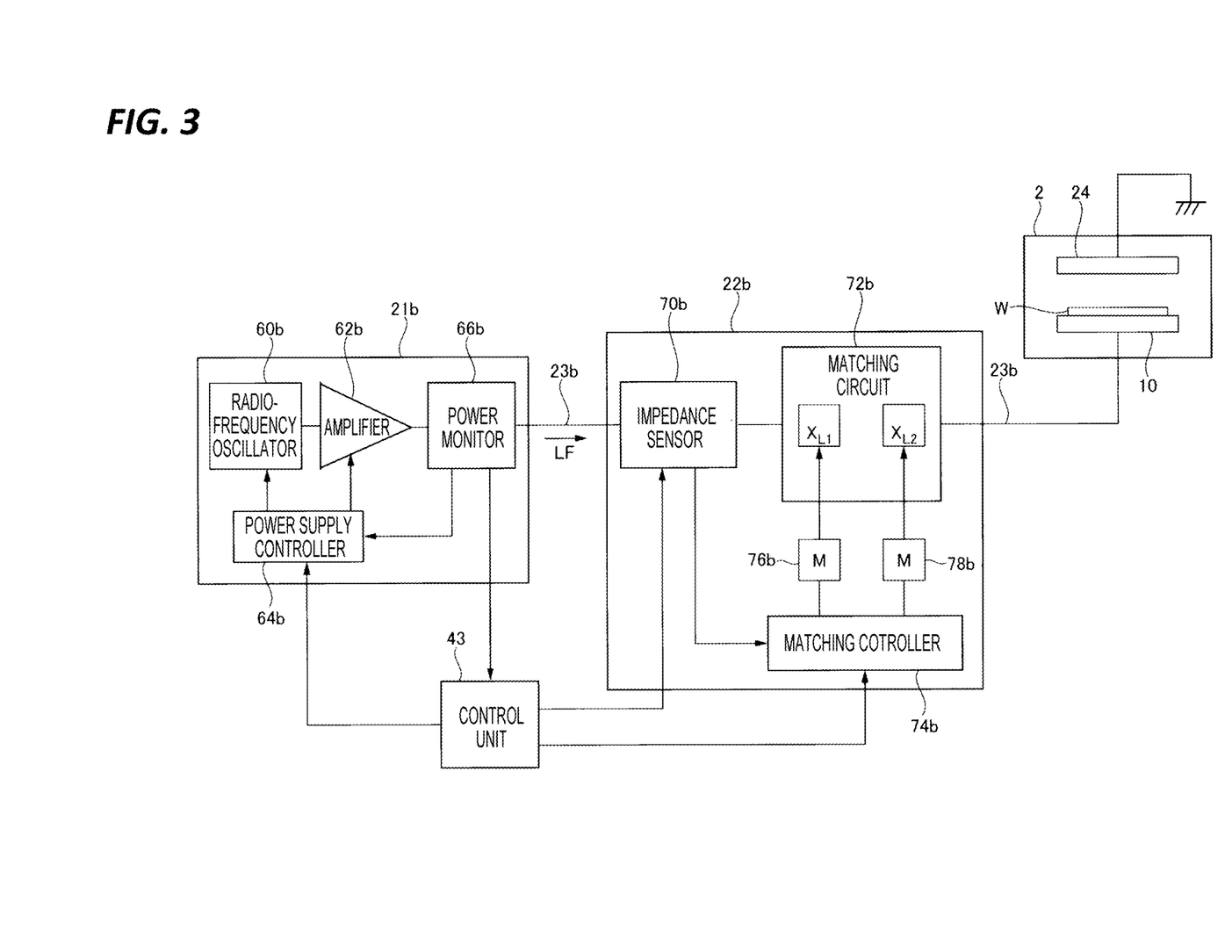
FIG. 3 is a block diagram illustrating a configuration of a radio-frequency power supply for ion implantation and a matcher of the substrate processing apparatus according to the embodiment.

FIG. 3 is a block diagram illustrating a configuration of the second radio-frequency power supply 21b for ion implantation and the matcher 22b of the substrate processing apparatus 1 according to the embodiment.

The second radio-frequency power supply 21b outputs second radio-frequency power LF having a second frequency (e.g., 40 kHz) lower than the first frequency (e.g., 40 MHz) to the matcher 22b via a radio-frequency feeding line 23b. The second radio-frequency power supply 21b includes a radio-frequency oscillator 60b, a power amplifier 62b, a power supply control unit 64b, and a power monitor 66b.

The radio-frequency oscillator 60b is an oscillator that generates sine waves or fundamental waves having a constant frequency (e.g., 400 kHz) suitable for ion implantation. The power amplifier 62b is an amplifier that amplifies the power of the fundamental waves output from the radio-frequency oscillator 60b with a gain or amplification factor that may be variably controlled. The power supply control unit 64b is a controller that directly controls the radio-frequency oscillator 60b and the power amplifier 62b according to a control signal from the control unit 43.

The power monitor 66b detects the power of the radio-frequency power on the radio-frequency feeding line 23b. The power monitor 66b includes a directional coupler on the radio-frequency feeding line 23b. The power monitor 66b detects the power PF2 of progressive waves propagating in the forward direction on the radio-frequency feeding line 23b, i.e., from the second radio-frequency power supply 21b to the matcher 22b. Further, the power monitor 66b detects the power RF2 of reflected waves propagating in the reverse direction on the radio-frequency feeding line 23b, i.e., from the matcher 22b to the second radio-frequency power supply 21b. Then, the power monitor 66b outputs the detection result to the power supply control unit 64b and the control unit 43. The power supply control unit 64b uses the detection result for a power feedback control.

The matcher 22b matches the impedance of the second radio-frequency power supply 21b with the impedance of the base 11 (stage 10). The matcher 22b includes an impedance sensor 70b, a matching circuit 72b, and a matching controller 74b. The impedance sensor 70a is a detector that measures the impedance on the load side including the impedance of the matching circuit 72b on the radio-frequency feeding line 23b. The matching circuit 72b is a circuit including a plurality of (e.g., two) controllable reactance elements (e.g., variable capacitors or variable inductors) $X_{L1}$ and $X_{L2}$ which are connected to the radio-frequency feeding line 23b. The matching controller 84b is a controller that controls the reactance elements $X_{L1}$ and $X_{L2}$ respectively via a motor (M) 76b and a motor (M) 78b. The matching controller 74b controls the motors 76b and 78b such that the output impedance of the second radio-frequency power supply 21b and the impedance detected by the impedance sensor 70b match each other.

<Impedance Control>

The impedance control of the first radio-frequency power HF of the substrate processing apparatus 1 of the embodiment will be described. The substrate processing apparatus 1 of the embodiment changes a set value of impedance (set impedance) to be converted by the impedance converter 22a connected to the first radio-frequency power supply 21a.

Figure 4:
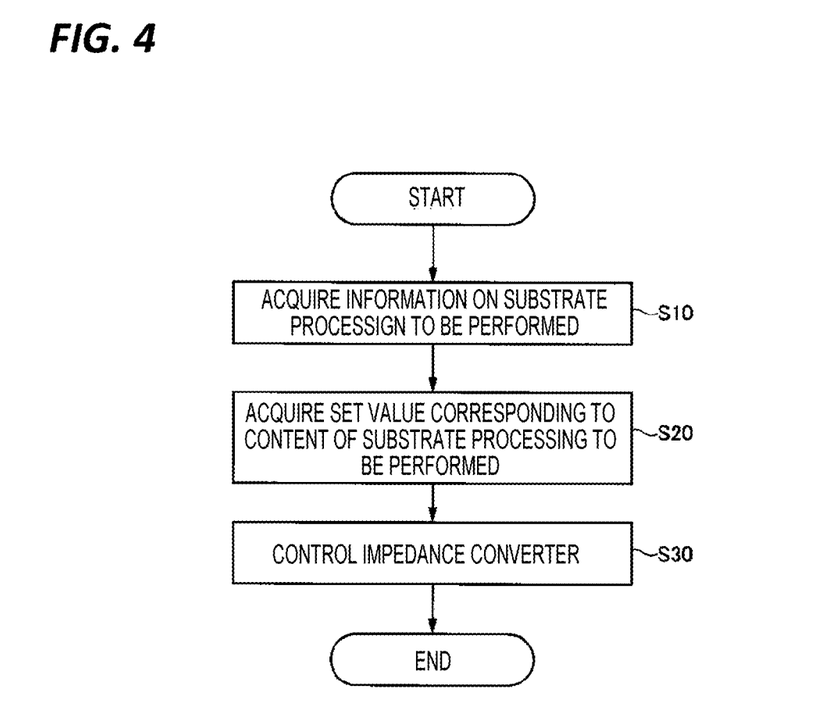
FIG. 4 is a flowchart for explaining a processing of a control unit of the substrate processing apparatus according to the embodiment.

FIG. 4 is a flowchart for explaining the control of the control unit 43 of the substrate processing apparatus 1 of the embodiment. A control method of the control unit 43 of the substrate processing apparatus 1 will be described with reference to FIG. 4.

(Step S10) The control unit 43 acquires information on a substrate processing to be performed in the substrate processing apparatus 1. For example, a substrate processing to be performed is input by an operator from an input unit such as a keyboard. The control unit 43 acquires information on the substrate processing to be performed in the substrate processing apparatus 1 input from the input unit. Further, the control unit 43 may automatically acquire information on the substrate processing to be performed in the substrate processing apparatus 1 from a processing recipe.

(Step S20) The control unit 43 acquires a set value of impedance (set impedance) corresponding to the content of the substrate processing with respect to the substrate processing information acquired in step S10. For example, it is assumed that, with respect to the substrate processing to be performed, the set value of impedance (set impedance) suitable for the substrate processing is stored as a table in a storage such as a memory. Then, with respect to the input processing, the control unit 43 acquires the set value of impedance (set impedance) suitable for the substrate processing by referring to the table.

For the table in which the set value of impedance (set impedance) suitable for the substrate processing is stored, a set value of impedance (set impedance) suitable for the substrate processing to be performed is created from the evaluation result such as, for example, the etching rate of the substrate processing performed in the substrate processing apparatus 1.

(Step S30) The control unit 43 controls the impedance converter 22a using the set value of impedance (set impedance) acquired in step S20. Specifically, the control unit 43 controls the controller 74a of the impedance converter 22a such that the set value of impedance (set impedance) is obtained.

Then, the substrate processing apparatus 1 of the embodiment performs the substrate processing with the set value of impedance (set impedance) corresponding to the substrate processing to be performed.

Descriptions will be made on a case where the substrate processing apparatus 1 of the embodiment performs a plurality of substrate processings. For example, descriptions will be made on a case where the substrate processing apparatus 1 successively performs a first substrate processing and a second substrate processing. The control unit 43 of the substrate processing apparatus 1 acquires information on the first substrate processing and the second substrate processing to be performed in step S10. Then, when the first substrate processing is firstly performed, the control unit 43 acquires a first set value of impedance corresponding to the content of the first substrate processing (step S20). Then, the control unit 43 controls the impedance converter 22a using the first set value (step S30). Then, the substrate processing apparatus 1 performs the first substrate processing. Next, when the second substrate processing is performed, the control unit 43 acquires a second set value of impedance corresponding to the content of the second substrate processing (step S20). Then, the control unit 43 controls the impedance converter 22a using the second set value (step S30). Then, the substrate processing apparatus 1 performs the second substrate processing.

When the substrate processing apparatus 1 of the embodiment performs a plurality of substrate processings, the controller 43 sets a set value of impedance (set impedance) for each substrate processing as described above. Then, the substrate processing apparatus 1 performs each substrate processing using the set value of impedance (set impedance) corresponding to that substrate processing.

[Behavior Upon Simultaneous Supply of First Radio-Frequency Power HF and Second Radio-Frequency Power LF]

In the substrate processing apparatus 1 of the embodiment, descriptions will be made on a behavior when the first radio-frequency power HF and the second radio-frequency power LF are simultaneously supplied to the base 11.

Figure 5A:
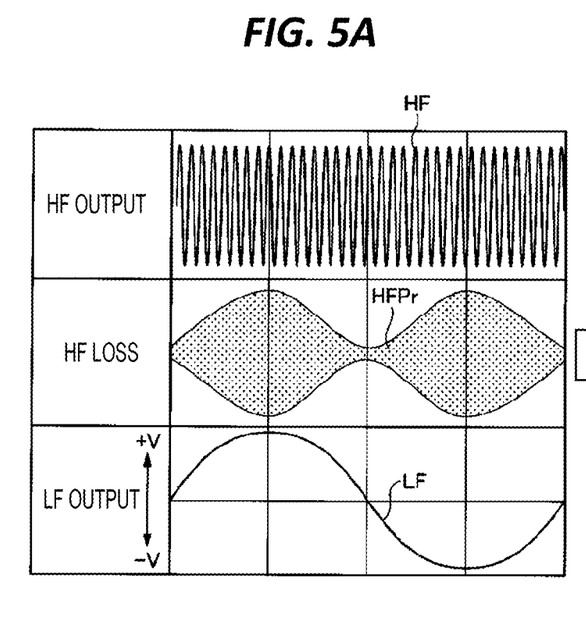
FIGS. 5A and 5B are diagrams for explaining waveforms when radio-frequency power is supplied in the substrate processing apparatus according to the embodiment.
Figure 5B:
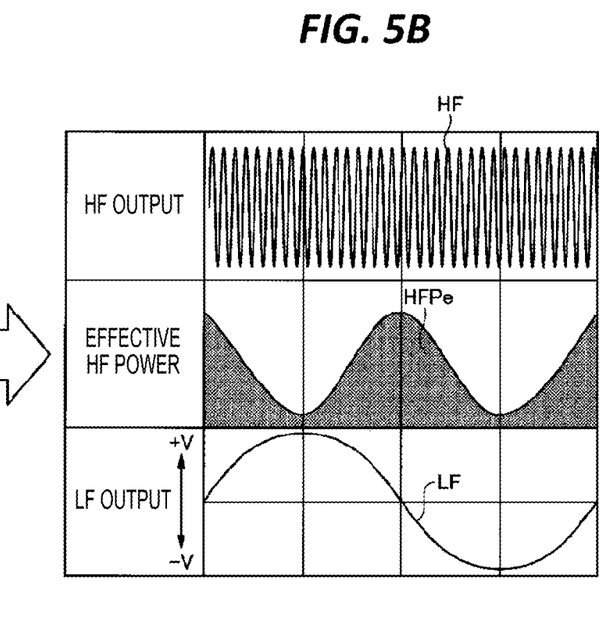

FIGS. 5A and 5B are diagrams for conceptually explaining waveforms of the first radio-frequency power HF and the second radio-frequency power LF when the first radio-frequency power HF and the second radio-frequency power LF are supplied to the base 11 in the substrate processing apparatus 1 of the embodiment. In FIGS. 5A and 5B, the impedance is matched in the impedance converter 22a. This is, for example, a state where the output impedance of the first radio-frequency power supply 21a and the impedance of the impedance converter 22a seen from the first radio-frequency power supply 21a including the load due to plasma match each other.

The upper part of FIG. 5A illustrates the waveform of the voltage of the first radio-frequency power HF from the first radio-frequency power supply 21a. The frequency of the first radio-frequency power HF (first frequency) is, for example, 40 MHz. The lower part of FIG. 5A illustrates the waveform of the voltage of the second radio-frequency power LF from the second radio-frequency power supply 21b. The frequency of the second radio-frequency power LF (second frequency) is, for example, 400 kHz. The middle part of FIG. 5A illustrates the loss of the first radio-frequency power HF due to the reflected wave HFPr returning from the base 11 to the first radio-frequency power supply 21a. In FIGS. 5A and 5B, the reflected wave HFPr is conceptually represented by an envelope. The reflected wave HFPr is the power of the reflected wave due to intermodulation distortion (IMD). Since the reflected wave HFPr is a power signal returning to the first radio-frequency power supply 21a, it does not contribute to the generation of plasma.

FIG. 5B illustrates the effective power HFPe of the first radio-frequency power HF that contributes to the generation of plasma. The upper and lower parts of FIG. 5B are the same as those of FIG. 5A. The middle part of FIG. 5B illustrates the effective power HFPe obtained by subtracting the power of the reflected wave HFPr from the power of the first radio-frequency power HF.

As illustrated in FIGS. 5A and 5B, in the impedance matching state of the impedance converter 22a, when the voltage of the second radio-frequency power LF has positive and negative peaks, the loss of the first radio-frequency power HF, i.e., the reflected wave HFPr becomes large. Meanwhile, when the voltage of the second radio-frequency power LF is near zero, the loss of the first radio-frequency power HF, i.e., the reflected wave HFPr becomes small.

[Behavior by Set Impedance of Impedance Converter 22a]

Next, descriptions will be made on a behavior of the impedance converter 22a when the set impedance is changed.

Figure 6A:
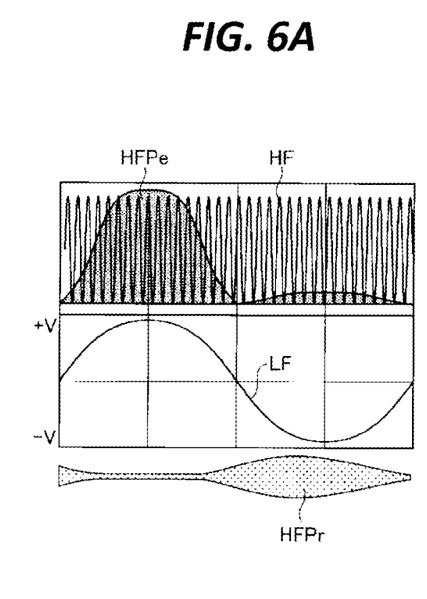
FIGS. 6A to 6C are diagrams for explaining the influence of waveforms due to impedances when radio-frequency power is supplied in the substrate processing apparatus according to the embodiment.
Figure 6B:
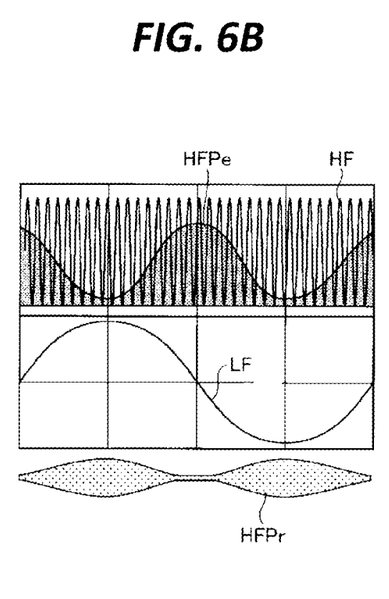
Figure 6C:
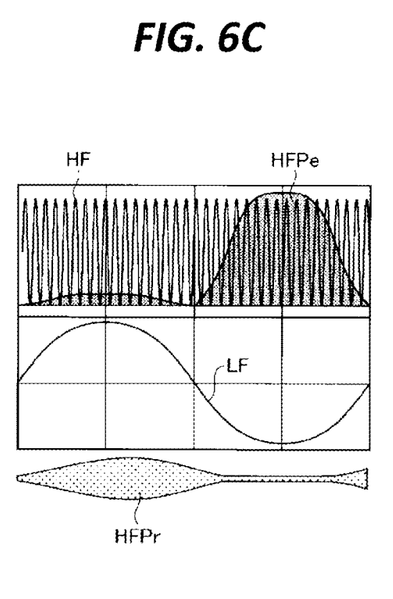

FIGS. 6A to 6C are diagrams for conceptually explaining the influence of the set impedance of the impedance converter 22a when the first radio-frequency power HF and the second radio-frequency power LF are supplied to the base 11 in the substrate processing apparatus 1 of the embodiment. Each of FIGS. 6A to 6C illustrates the waveform of the voltage of the first radio-frequency power HF, the effective power HFPe of the first radio-frequency power HF, the waveform of the voltage of the second radio-frequency power LF, and the loss of the first radio-frequency power HF due to the reflected wave HFPr from the top.

FIG. 6B illustrates the waveform in the impedance matching state of the impedance converter 22a. FIGS. 6A and 6C illustrate the waveforms in the impedance non-matching state of the impedance converter 22a.

As described in the explanation with reference to FIGS. 5A and 5B, in the impedance matching state (FIG. 6B), the loss of the first radio-frequency power HF, i.e., the reflected wave HFPr becomes large when the voltage of the second radio-frequency power LF has positive and negative peaks. Meanwhile, when the voltage of the second radio-frequency power LF is near zero, the loss of the first radio-frequency power HF, i.e., the reflected wave HFPr becomes small. Thus, in a case of FIG. 6B, the effective power HFPe of the first radio-frequency power HF becomes the largest when the voltage of the second radio-frequency power LF is near zero. Meanwhile, the effective power HFPe of the first radio-frequency power HF becomes the smallest when the voltage of the second radio-frequency power LF has positive and negative peaks.

Meanwhile, in the impedance non-matching state, the loss of the first radio-frequency power HF, i.e., the peak of the reflected wave HFPr differs from that in the impedance matching state.

In a case of FIG. 6A, when the voltage of the second radio-frequency power LF has a negative peak, the loss of the first radio-frequency power HF, i.e., the reflected wave HFPr becomes large. Meanwhile, when the voltage of the second radio-frequency power LF has a positive peak, the loss of the first radio-frequency power HF, i.e., the reflected wave HFPr becomes small. Thus, in the case of FIG. 6A, the effective power HFPe of the first radio-frequency power HF becomes the largest when the voltage of the second radio-frequency power LF has a positive peak. Meanwhile, the effective power HFPe of the first radio-frequency power HF becomes small when the voltage of the second radio-frequency power LF has a negative peak.

In a case of FIG. 6C, when the voltage of the second radio-frequency power LF has a positive peak, the loss of the first radio-frequency power HF, i.e., the reflected wave HFPr becomes large. Meanwhile, when the voltage of the second radio-frequency power LF has a negative peak, the loss of the first radio-frequency power HF, i.e. the reflected wave HFPr has a negative peak, and at this time, the effective power HFPe of the first radio-frequency power HF becomes the largest. Meanwhile, the effective power HFPe of the first radio-frequency power HF becomes small when the voltage of the second radio-frequency power LF has a positive peak.

Therefore, unlike the impedance matching case in the related art, by making the impedance non-matching state, the timing at which the peak of the reflected wave due to intermodulation distortion occurs may be changed with respect to the voltage of the second radio-frequency power LF. For example, the set impedance may be set such that the peak of the reflected wave HFPr occurs when the voltage of the second radio-frequency power LF has a positive peak or a negative peak.

Specific waveforms when the set value of impedance (set impedance) is changed are illustrated in FIGS. 7A to 7C and FIG. 8. For the waveforms, the first radio-frequency power HF, the second radio-frequency power LF, and the reflected wave HFPr were measured by an oscilloscope while changing the set impedance of the impedance converter 22a. The average power of the first radio-frequency power HF was measured. The average power of the first radio-frequency power HF was set to be constant. Further, in FIG. 8, the set value of impedance (set impedance) is plotted on the coordinate axes of the set resistance and the set reactance to be described later, and the waveforms related to the set value are combined.

Figure 8:
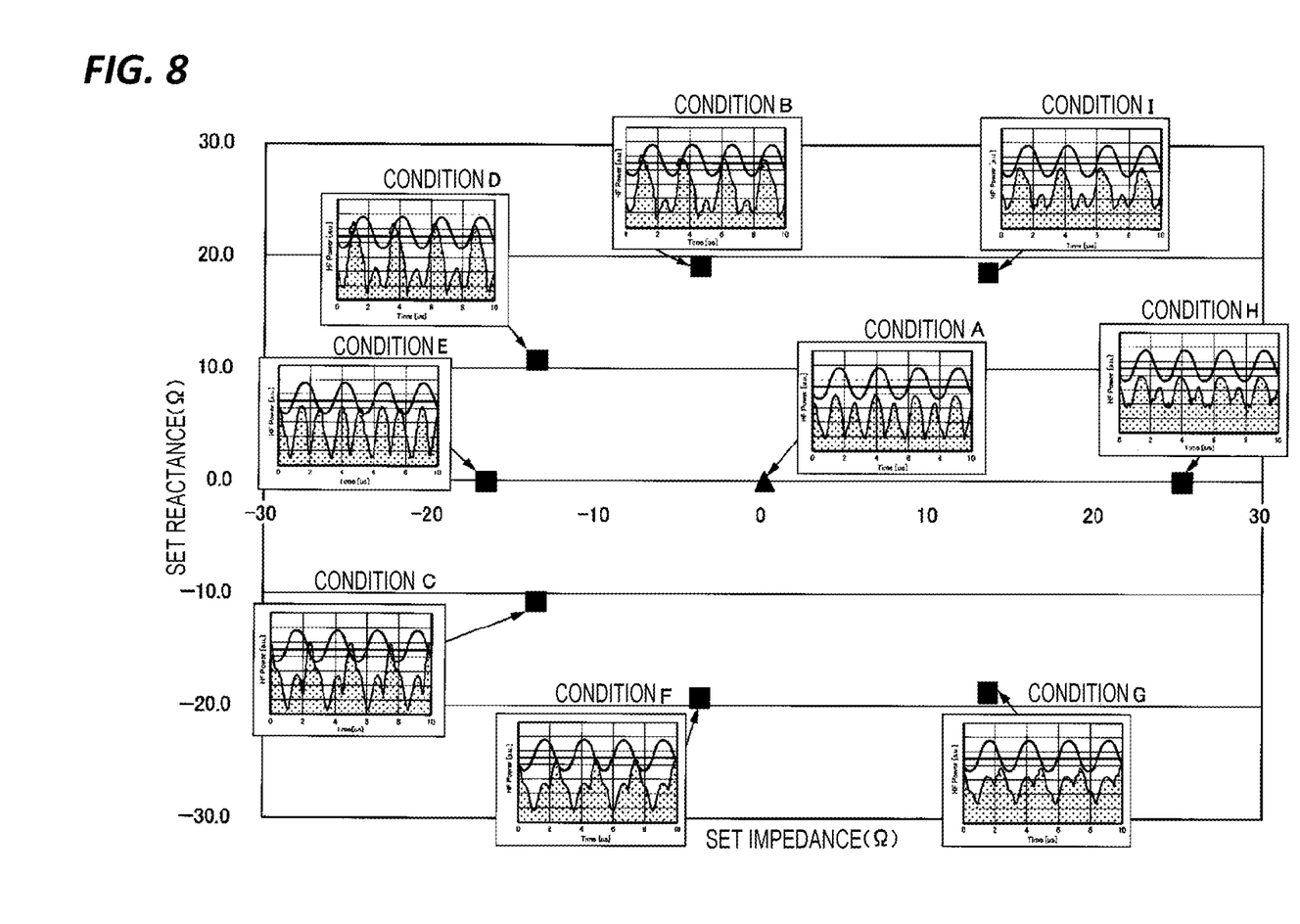
FIG. 8 is a diagram illustrating a relationship between impedances and waveforms when radio-frequency power is supplied in the substrate processing apparatus according to the embodiment.

Table 1 summarizes the set impedance of the impedance converter 22a. The set impedance is represented by the difference between the resistance and the reactance from the matching state. Thus, under the matching condition A, the set resistance and the set reactance are zero.

TABLE 1

| Condition | Set Resistance (Ω) | Set Reactance (Ω) |
|---|---|---|
| Condition A (Matching State) | 0 | 0 |
| Condition B | −3.8 | 19.2 |
| Condition C | −13.7 | −10.7 |
| Condition D | −13.7 | 10.7 |
| Condition E | −16.7 | 0 |
| Condition F | −3.8 | −19.2 |
| Condition G | 13.4 | −18.7 |
| Condition H | 25 | 0 |
| Condition I | 13.4 | 18.7 |

Figure 7A:
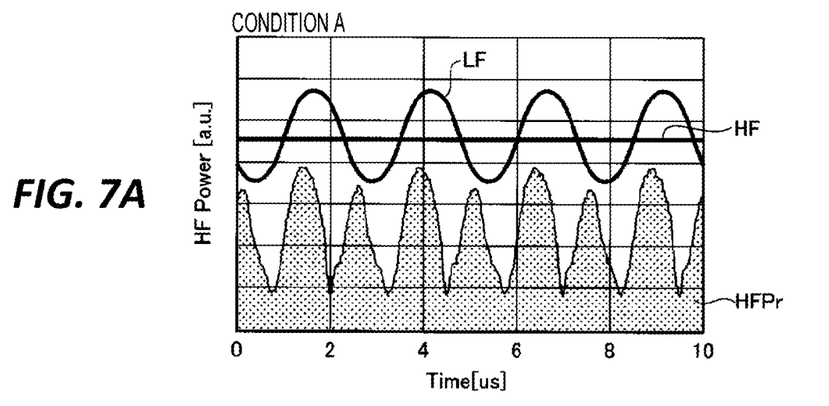
FIGS. 7A to 7C are diagrams illustrating waveforms at predetermined impedances when radio-frequency power is supplied in the substrate processing apparatus according to the embodiment.
Figure 7B:
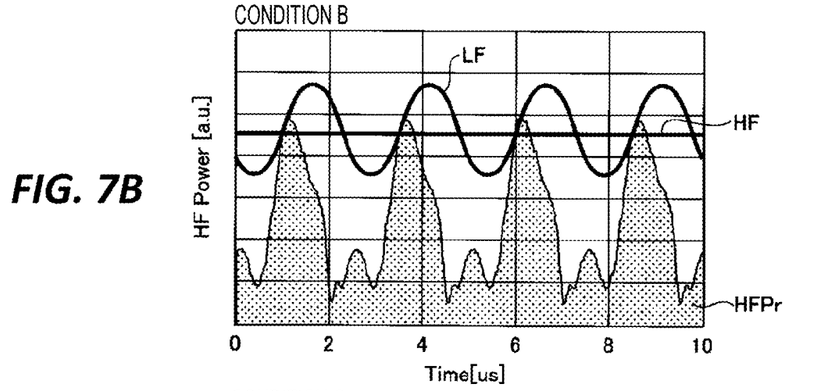
Figure 7C:
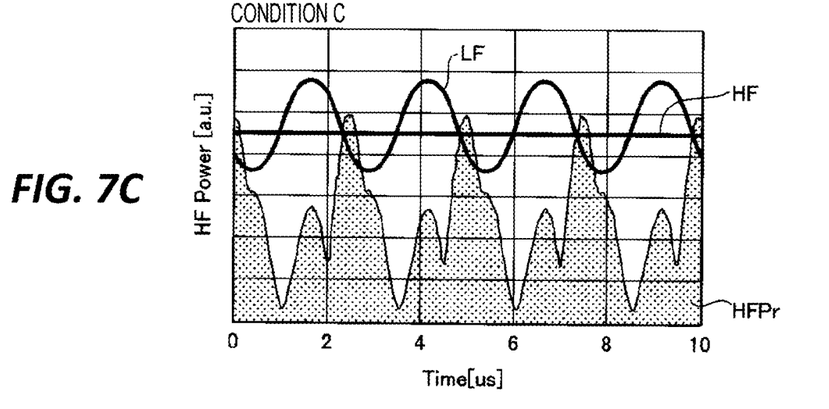

The timing at which the peak of the reflected wave HFPr occurs differs with respect to the voltage (phase) of the second radio-frequency power LF by the set impedance of the impedance converter 22a.

For example, in a case of the condition A of FIG. 7A, i.e., in a case of the matching state, the reflected wave HFPr becomes large when the voltage of the second radio-frequency power LF has positive and negative peaks. In a case of the condition B of FIG. 7B, the reflected wave HFPr becomes small when the voltage of the second radio-frequency power LF has a negative peak. In a case of the condition C of FIG. 7C, the reflected wave HFPr becomes small when the voltage of the second radio-frequency power LF has a positive peak.

Figure 9:
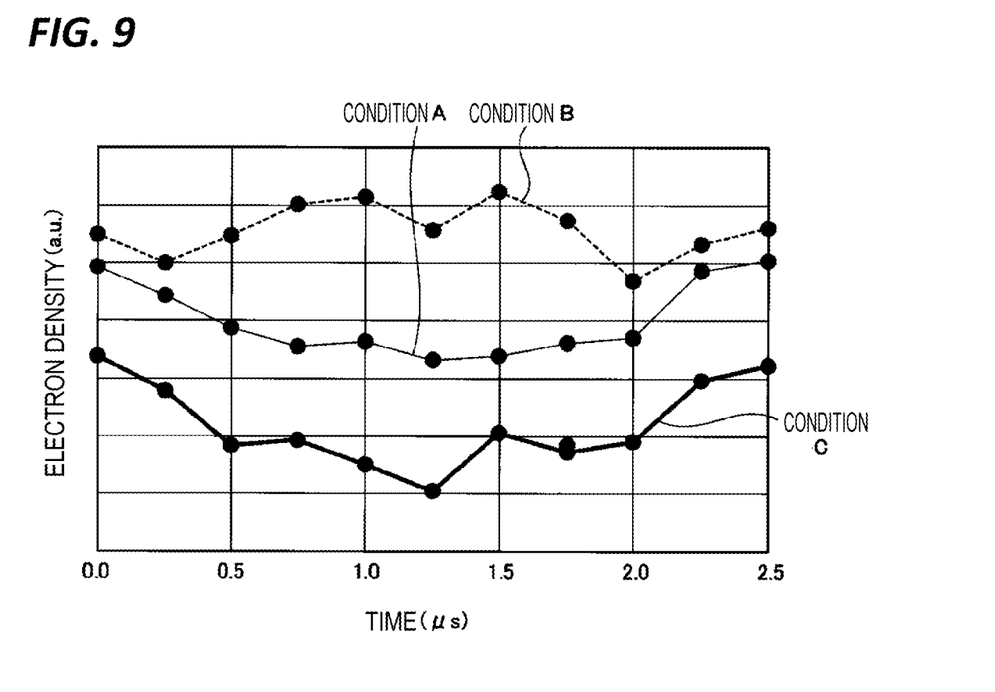
FIG. 9 is a diagram illustrating a relationship between impedances and plasma electron densities when radio-frequency power is supplied in the substrate processing apparatus according to the embodiment.
Figure 10:
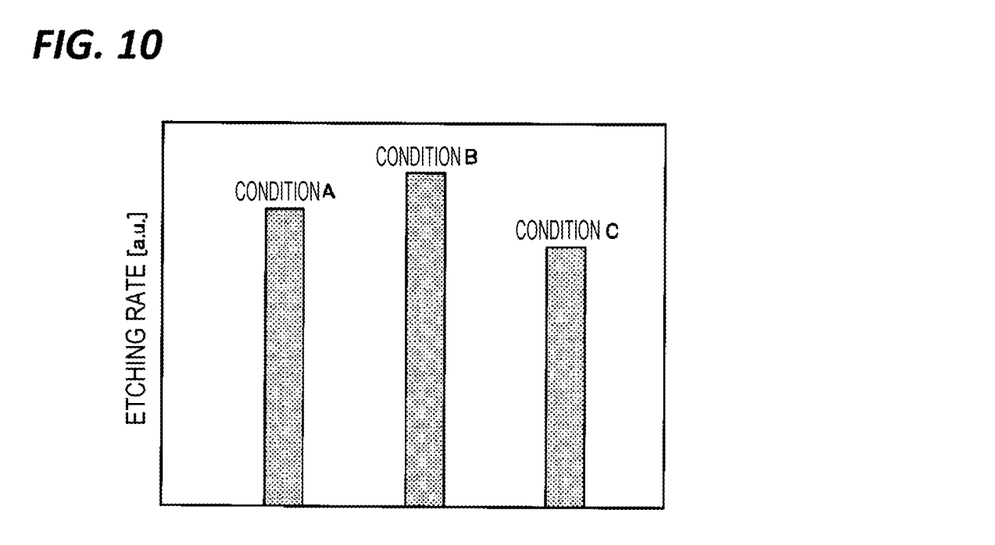
FIG. 10 is a diagram illustrating a relationship between impedances and etching rates when radio-frequency power is supplied in the substrate processing apparatus according to the embodiment.

FIG. 9 illustrates the electron density of plasma when the set impedance of the impedance converter 22a is changed. The horizontal axis of the graph in FIG. 10 represents time. The range on the horizontal axis of the graph in FIG. 9 corresponds to one cycle of the second radio-frequency power LF. The vertical axis of the graph in FIG. 9 represents the electron density of plasma.

From the result of FIG. 9, the electron density of plasma may be increased by setting the condition B as the set impedance of the impedance converter 22a.

Furthermore, FIG. 10 illustrates the etching rate of silicon oxide when the set impedance of the impedance converter 22a is changed. The vertical axis of the graph in FIG. 10 represents the etching rate.

From the result of FIG. 10, the etching rate may be increased by setting the condition B as the set impedance of the impedance converter 22a.

Here, as for the substrate processing to be performed, an impedance suitable for the substrate processing will be described. The substrate processing apparatus 1 of the embodiment sets the set value of impedance (set impedance) such that the peak of the reflected wave is in a predetermined period with respect to the voltage (phase) of the second radio-frequency power LF.

First, consideration will be made on, for example, a case where an etching processing with a radio-etching rate is desired to be performed. As described above, when the first radio-frequency power is supplied with the impedance of the condition B in the substrate processing apparatus 1, the electron density of plasma may be increased. Further, the etching rate may be increased. Thus, for the etching processing with a radio-etching rate, the condition B is set as the impedance suitable for the substrate processing. Specifically, the set value of impedance (set impedance) at which the reflected wave has a peak in the period during which the voltage of the second radio-frequency power LF is negative, particularly the period during which the voltage of the second radio-frequency power LF is near a negative peak is set. By supplying the first radio-frequency power HF with the impedance of the condition B, a large amount of ions reacts with radio-energy, which may promote the etching processing.

Next, consideration will be made on, for example, a case where it is desired to perform an etching processing with radio-selectivity (for example, a case where the etching processing is selected according to the etching depth). When the first radio-frequency power HF is supplied with the impedance of condition C in the substrate processing apparatus 1, the surface layer adhesion of ions or radicals and the radio-energy reaction of ions are repeatedly performed.

A specific processing will be described. When the voltage of the second radio-frequency power LF has a positive peak, the effective power of the first radio-frequency power HF increases, so that the dissociation of a reaction gas is promoted and the amount of ions and radicals increases. Then, since the voltage of the second radio-frequency power LF has a positive peak when the dissociation of ions and radicals is promoted, the dissociated radials adhere to the surface layer. The types of the dissociated ions or radicals differ depending on the power of the first radio-frequency power HF supplied. For example, in a case where $C_4F_6$ is used as an etching gas, a large amount of radicals having a low degree of dissociation and a radio-adhesion coefficient (e.g., $C_xF_y$) is created when the power of the first radio-frequency power HF supplied is small. The radicals having a radio-adhesion coefficient play a role of protecting, for example, a mask by adhering to the surface layer of a processing target. Meanwhile, when the power of the first radio-frequency power HF supplied is large, a large amount of radicals having a radio-degree of disassociation and a low adhesion coefficient (e.g., $CF_2$, $CF$, $CF_3$) is created. The radicals having a low adhesion coefficient are transported to the bottom of an etched structure, which further contributes to etching. Then, when the voltage of the second radio-frequency power LF has a negative peak, the dissociated ions are supplied to the bottom, thereby promoting the etching processing. As described above, the surface layer adhesion of ions or radicals and the high-energy reaction of ions are repeated with the cycle of the second radio-frequency power LF.

As described above, by setting the impedance such that the reflected wave becomes large when the voltage of the second radio-frequency power LF is negative, the etching processing with selectivity may be performed depending on the difference in the adhesion coefficient of ions or radicals. Thus, for the etching processing with selectivity, the condition C is set as the impedance suitable for the substrate processing. Specifically, the set value of impedance (set impedance) at which the reflected wave has a peak for the period during which the voltage of the second radio-frequency power LF is positive, particularly the period during which the voltage of the second radio-frequency power LF is near a positive peak is set.

The impedance suitable for the substrate processing is not limited to the condition B and the condition C. For example, by selecting separate conditions, etching having intermediate characteristics of the respective substrate processings of the conditions B and C may be performed.

ACTION AND EFFECT

With the substrate processing apparatus 1 of the embodiment, in the plasma processing apparatus, the power timing at which the first radio-frequency power for plasma generation is supplied may be adjusted with respect to the voltage (phase) of the second radio-frequency power LF for ion implantation. That is, by setting the impedance of the impedance converter 22a of the substrate processing apparatus 1 of the embodiment to the non-matching state, the timing at which the reflected wave is generated may be changed with respect to the voltage (phase) of the second radio-frequency power LF. Then, by changing the timing at which the reflected wave is generated with respect to the voltage (phase) of the second radio-frequency power LF, the power supply timing at which the first radio-frequency power is supplied to plasma at a radio-power with respect to the voltage (phase) of the second radio-frequency power LF may be adjusted. Then, the impedance suitable for the processing may be set by the substrate processing apparatus 1 of the embodiment.

The substrate processing apparatus of the present disclosure may be applied to any type such as capacitively coupled plasma (CCP), inductively coupled plasma (ICP), plasma generated using microwaves, for example, plasma generated by a radial line slot antenna (RLSA), electron cyclotron resonance plasma (ECR), and helicon wave plasma (HWP).

The present disclosure provides a technique of adjusting the timing at which radio-frequency power for plasma generation is supplied to plasma at a radio-power with respect to radio-frequency power for ion implantation in a plasma etching apparatus.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus, comprising:
a substrate stage configured to dispose a substrate thereon;
a first radio-frequency power supply configured to supply a first radio-frequency power having a first frequency to the substrate stage;
an impedance converter configured to convert an impedance on a load side seen from the first radio-frequency power supply into a set impedance;
a second radio-frequency power supply configured to supply a second radio-frequency power having a second frequency lower than the first frequency to the substrate stage; and
a controller configured to control the set impedance of the impedance converter, according to a substrate processing, such that a peak of a reflected wave propagating from the impedance converter to the first radiofrequency power supply is in a period during which a voltage of the second radio-frequency power is negative.

2. The apparatus according to claim 1, wherein the controller sets the set impedance according to an electron density of plasma.

3. The apparatus according to claim 1, wherein the controller sets the set impedance according to an etching rate.

4. The apparatus according to claim 1, wherein the controller sets the set impedance according to an etching depth.

5. The apparatus according to claim 1, wherein the controller sets the set impedance such that the peak of the reflected wave propagating from the impedance converter to the first radio-frequency power supply is in a predetermined period with respect to the voltage of the second radio-frequency power.

6. The apparatus according to claim 1, wherein the controller sets the set impedance for each substrate processing when a plurality of substrate processings is performed.

7. A method of controlling a substrate processing apparatus, the method comprising:
   disposing a substrate on a substrate stage;
   supplying, by a first radio-frequency power supply, a first radio-frequency power having a first frequency to the substrate stage;
   converting, by an impedance converter, an impedance on a load side seen from the first radio-frequency power supply into a set impedance;
   supplying, by a second radio-frequency power supply, a second radio-frequency power having a second frequency lower than the first frequency to the substrate stage; and
   controlling the set impedance of the impedance converter, according to a substrate processing, such that a peak of a reflected wave propagating from the impedance converter to the first radio-frequency power supply is in a period during which a voltage of the second radio-frequency power is positive.

8. A substrate processing apparatus, comprising:
   a substrate stage configured to dispose a substrate thereon;
   a first radio-frequency power supply configured to supply a first radio-frequency power having a first frequency to the substrate stage;
   an impedance converter configured to convert an impedance on a load side seen from the first radio-frequency power supply into a set impedance;
   a second radio-frequency power supply configured to supply a second radio-frequency power having a second frequency lower than the first frequency to the substrate stage; and
   a controller configured to control the set impedance of the impedance converter, according to a substrate processing, such that a peak of a reflected wave propagating from the impedance converter to the first radio-frequency power supply is in a period during which a voltage of the second radio-frequency power is positive.

* * * * *